(12) United States Patent
Dhinojwala et al.

(10) Patent No.: US 10,245,625 B2
(45) Date of Patent: Apr. 2, 2019

(54) CARBON NANOTUBE-BASED ROBUST STEAMPHOBIC SURFACES

(75) Inventors: Ali Dhinojwala, Akron, OH (US); Sunny Sethi, Copley, OH (US); Ila Badge, Akron, OH (US)

(73) Assignee: THE UNIVERSITY OF AKRON, Akron, OH (US)

( * ) Notice: Subject to any disclaimer, the term of this patent is extended or adjusted under 35 U.S.C. 154(b) by 648 days.

(21) Appl. No.: 14/131,254

(22) PCT Filed: Jul. 9, 2012

(86) PCT No.: PCT/US2012/045924
§ 371 (c)(1),
(2), (4) Date: Mar. 28, 2014

(87) PCT Pub. No.: WO2013/009684
PCT Pub. Date: Jan. 17, 2013

(65) Prior Publication Data
US 2014/0213130 A1    Jul. 31, 2014

Related U.S. Application Data

(60) Provisional application No. 61/505,589, filed on Jul. 8, 2011.

(51) Int. Cl.
| | | |
|---|---|---|
| *C23C 18/00* | (2006.01) | |
| *B08B 17/06* | (2006.01) | |
| *C23C 16/505* | (2006.01) | |
| *B05D 5/08* | (2006.01) | |
| *B05D 1/00* | (2006.01) | |

(52) U.S. Cl.
CPC ............. *B08B 17/065* (2013.01); *B05D 1/62* (2013.01); *B05D 5/083* (2013.01); *C23C 16/505* (2013.01); *Y10T 428/249921* (2015.04); *Y10T 428/249962* (2015.04); *Y10T 428/249964* (2015.04); *Y10T 442/2164* (2015.04); *Y10T 442/2189* (2015.04)

(58) Field of Classification Search
CPC ....... B08B 17/065; C23C 16/505; B05D 1/62; B05D 5/083; B32B 9/00; Y10T 428/249921; Y10T 428/249962; Y10T 428/249964; Y10T 442/2464; Y10T 442/2189
USPC ................................ 977/742–754, 842–848; 423/447.1–447.3, 455 B
See application file for complete search history.

(56) References Cited

U.S. PATENT DOCUMENTS

| | | |
|---|---|---|
| 6,551,950 B1 | 4/2003 | Badyal et al. |
| 6,649,222 B1 | 11/2003 | D'Agostino et al. |
| 7,144,476 B2 | 12/2006 | Wilde et al. |
| 2002/0114954 A1 | 8/2002 | Badyal et al. |
| 2006/0159934 A1 | 7/2006 | Reins et al. |
| 2006/0257642 A9 | 11/2006 | Mikhael et al. |
| 2007/0005024 A1 | 1/2007 | Weber et al. |
| 2007/0104922 A1 | 5/2007 | Zhai et al. |
| 2009/0011222 A1 | 1/2009 | Xiu et al. |
| 2010/0282668 A1 | 11/2010 | Cooper et al. |

*Primary Examiner* — Arti Singh-Pandey
(74) *Attorney, Agent, or Firm* — Renner Kenner Greive Bobak Taylor & Weber

(57) ABSTRACT

A method for creating a superhydrophobic coated nanoporous assembly includes the steps of: providing a nanoporous assembly formed of discrete and/or continuous structures that provide a morphology defining pores of less than 1 micron between neighboring discrete and continuous structures; bringing gaseous plasma precursors in the presence of the nanoporous assembly and in the presence of a plasma generator; employing the plasma generator to convert the gaseous plasma precursors to the plasma state; and permitting the plasma precursors to deposit as a coating on the nanoporous assembly through plasma polymerization techniques the deposition thereof preserving the porous structure of the nanoporous assembly, the deposited coating exhibiting a surface energy of less than 30 dynes/cm.

10 Claims, 12 Drawing Sheets

CARBON NANOTUBE-BASED ROBUST STEAMPHOBIC SURFACES

FIELD OF THE INVENTION

The present invention relates to an apparatus and method for the production of superhydrophobic surface coatings. In particular embodiments, this invention provides methods for creating superhydrophobic surfaces. In other embodiment, this invention provides such superhydrophobic surface, which, in yet other embodiments, are found to be steam and ice resistant.

BACKGROUND OF THE INVENTION

Surfaces that remain dry under a flux of steam are desired for many applications, such as the blades of steam turbines and the surfaces of heat exchangers. Different techniques are employed to create water-repellent surfaces, commonly referred to as superhydrophobic surfaces. They are defined as surfaces on which water forms a contact angle of greater than 150° and are formed by a suitable combination of surface chemistry and roughness. However, the ability of a surface to remain dry by letting water droplets roll off depends on the contact angle hysteresis (CAH) defined as the difference between advancing and receding water contact angles on a surface. The major factor influencing the CAH on a superhydrophobic surface is the superhydrophobic state of the water droplets. A droplet of water on such a surface may be in a wetting state (Wenzel state) with water completely filling the roughness asperities on the surface or a nonwetting state (Cassie-Baxter state) with the water droplet supported on the air-solid composite surface. In the Cassie-Baxter state, water droplets have lower CAH and easily roll off the surface as compared to those in the Wenzel state.

Compared to the water repellency of a superhydrophobic surface where a water droplet is deposited on the surface, in the case of the condensation of water vapor on such a surface the formation of a water droplet follows a nucleation and growth mechanism where nucleation may be initiated within the pores. This would result in the formation of water droplets in the Wenzel state. Therefore, a superhydrophobic surface that has a low contact angle hysteresis with liquid water may not show similar behavior in the case of steam condensation. For the surface to remain dry under condensation, it is required that the water droplets undergo a transition from the Wenzel to the Cassie-Baxter regime. Depending on if this transition is favorable thermodynamically, a typical superhydrophobic surface may or may not act as an anticondensation surface. Few approaches proposed and tested in the past to create surfaces that can undergo such a transition include the design of surfaces with differential intrinsic wettability in the form of either a continuous gradient or patches of hydrophilic-hydrophobic regions on the surface. A similar vertical surface energy gradient was proposed to explain the ability of a lotus leaf to remain dry under dew formation. The systematic design of roughness features on the surface such that the nanoscale roughness is present as either part of the structural hierarchy or the surface being nanoporous by itself has also been shown as a design approach to making a surface remain dry under condensation. However, the exact mechanism behind the wetting behavior of a structured surface under condensation is still not understood completely. All of the condensation studies reported pertain to the low temperature and pressure of the condensing water vapor, typically carried out in the range of 0-5° C. In the case of steam condensation, the mechanism of droplet formation is similar to low-temperature condensation. However, the high-temperature, high-pressure environment of condensing steam to which the surface is exposed may exceed the mechanical and hydrostatic stability limits of the nonwetting state of the surface. Thus, the stability limitations make it more difficult to design a steamphobic surface even though control over the surface energy and geometry is easily achieved with a wide range of materials.

This work creates unique coatings for stainless steel that remain dry under prolonged exposure to steam and maintain their superhydrophobicity. The coatings are formed using a meshlike carbon nanotube (CNT) structure. The structure provides the desired surface roughness and porosity. The chemistry of CNT structures is modified using plasma-enhanced chemical vapor deposition (PECVD), more commonly known as the plasma polymerization process.

SUMMARY OF THE INVENTION

In one embodiment, this invention provides a method for creating a superhydrophobic coated nanoporous assembly comprising the steps of: providing a nanoporous assembly formed of discrete or continuous or both discrete and continuous structures that provide a morphology defining pores of less than 1 micron between neighboring discrete and continuous structures; bringing gaseous plasma precursors in the presence of the nanoporous assembly and in the presence of a plasma generator; employing the plasma generator to convert the gaseous plasma precursors to the plasma state; and permitting the plasma precursors to deposit as a coating on the nanoporous assembly through plasma polymerization techniques the deposition thereof preserving the porous structure of the nanoporous assembly, the deposited coating exhibiting a surface energy of less than 30 dynes/cm.

In other embodiments, this invention provides the method described above, wherein the nanoporous assembly is physically or chemically secured to a substrate.

In other embodiments, this invention provides the method described above, wherein the nanoporous assembly is selected from nanofibers, nanohairs, nanotubes and combinations thereof.

In other embodiments, this invention provides the method described above, wherein the nanoporous assembly is formed of materials selected from carbon, metals, ceramics and combinations thereof.

In other embodiments, this invention provides the method described above, wherein the nanoporous assembly is a plurality of carbon nanotubes.

In other embodiments, this invention provides the method described above, wherein the plasma precursors are selected from perfluorocarbons and perfluorinated compounds.

In other embodiments, this invention provides the method, wherein the plasma precursor is a monomer.

In other embodiments, this invention provides the method described above, wherein the plasma is created by using a radiofrequency generator or an electromagnetic device.

In other embodiments, this invention provides the method described above, wherein the pores range from 5 nm or more to 50 nm or less.

In other embodiments, this invention provides the method described above, wherein the surface energy of the nanoporous assembly ranges from 8 dynes/cm or more to 20 dynes/cm or less.

In other embodiments, this invention provides the method described above, wherein the plasma precursor is 1H,1H,2H-perfluoro-1-dodecene and the nanoporous assembly is formed of carbon nanotubes.

In another embodiment, this invention provides a coated nanoporous assembly exhibiting superhydrophobicity, the coated nanoporous assembly comprising: a nanoporous assembly formed of discrete or continuous or both discrete and continuous structures that provide a morphology defining pores of less than 1 micron between neighboring discrete and continuous structures; and a coating formed on said nanoporous assembly and preserving said morphology thereof, said coating having a surface energy of 30 dynes/cm or less.

In other embodiments, this invention provides the nanoporous assembly described above, wherein the nanoporous assembly is physically or chemically secured to a substrate.

In other embodiments, this invention provides the nanoporous assembly described above, wherein the nanoporous assembly is selected from nanofibers, nanohairs, nanotubes and combinations thereof.

In other embodiments, this invention provides the nanoporous assembly described above, wherein the nanoporous assembly is formed of materials selected from carbon, metals, ceramics and combinations thereof.

In other embodiments, this invention provides the nanoporous assembly described above, wherein the nanoporous assembly is a plurality of carbon nanotubes.

In other embodiments, this invention provides the nanoporous assembly described above, wherein the plasma precursor is a monomer.

In other embodiments, this invention provides the nanoporous assembly described above, wherein the plasma precursors are selected from perfluorocarbons and perfluorinated compounds.

In other embodiments, this invention provides the nanoporous assembly described above, wherein the plasma is created by using a radiofrequency generator or an electromagnetic device.

In other embodiments, this invention provides the nanoporous assembly described above, wherein the pores range from 5 nm or more to 50 nm or less.

In other embodiments, this invention provides the nanoporous assembly described above, wherein the surface energy of the nanoporous assembly ranges from 8 dynes/cm or more to 20 dynes/cm or less.

In other embodiments, this invention provides the nanoporous assembly described above, wherein the plasma precursor is 1H,1H,2H-perfluoro-1-dodecene and nanoporous assembly is formed of carbon nanotubes.

BRIEF DESCRIPTION OF THE DRAWINGS

These and other features and advantages of the present invention will become better understood with regard to the following description, appended claims, and accompanying drawings wherein:

DETAILED DESCRIPTION OF ILLUSTRATIVE EMBODIMENTS

Figure 1:
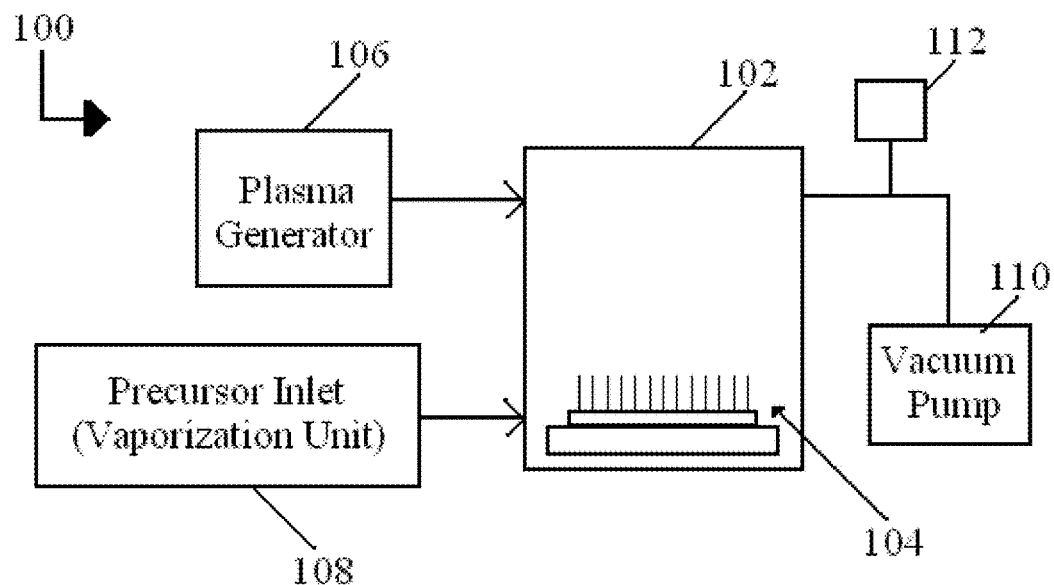
FIG. 1 is a block diagram representing a general experimental set-up for the plasma enhanced chemical vapor disposition process.

In accordance with this invention, nanoporous assemblies are created and coated with low surface energy coatings to create superhydrophobic surfaces, which are to be understood as surfaces that can remain dry in the presence of water in liquid form, and can be characterized by having a water contact angle of greater than 150°, with low contact angle hysteresis. In other embodiments, steamphobic surfaces are created, wherein steamphobic surfaces or surface exhibiting steamphobicity are to be understood as surfaces that remain dry under exposure to steam (water in gaseous form). In other embodiments, ice phobic surfaces are created, wherein by "ice phobic" it is meant that the formation of frost on the surface is retarded and ice will not strongly adhere to the surface. It will be appreciated that the steam phobicity and ice phobicity are subsets of superhydrophobicity. The coatings are formed from what are termed herein plasma precursors, and a plasma generator is employed to place the plasma precursor in the plasma state in the presence of the nanoporous assembly. The plasma precursor is polymerized and/or crosslinked through plasma polymerization, such that the plasma precursor forms an interconnected network deposited on the surface of the nanoporous assembly. The particular focus of this invention—the production of a desired superhydrophobic and/or steamphobic surface and/or ice phobic—is achieved by attending to two carefully chosen parameters—the morphology of the nanoporous constructs and the surface energy of the coatings.

The nanoporous assembly provides the necessary surface morphology for forming the desired coating from the plasma precursors. The nanoporous assembly is to be understood as any structure that provides desired morphology, which for purposes herein is to be understood as being pores of a nanoscale dimension, the pores being defined between neighboring discrete and/or continuous structures of the nanoporous assembly. The pores may be either well defined or amorphous in shape, and the largest dimension of the pores will be in the nanoscale range, i.e., less than 1 micron.

In particular embodiments, the largest distance between neighboring discrete and/or continuous portions of the nanoporous assembly is less than 1 micron. In other embodiments, this distance is less than 750 nanometers (nm), in other embodiments, less than 500 nm, in other embodiments, less than 250 nm, in other embodiments, less than 100 nm, in other embodiments, less than 50 nm, and in other embodiments, less than 30 nm. It will be appreciated that a mixture of such pore dimensions might be encountered in a given nanoporous assembly. In some embodiments, the pores are in the range of from 1 nm or more to 100 nm or less, in other embodiments, in the range of from 5 nm or more to 50 nm or less, in other embodiments, in the range of 5 nm or more to 30 nm or less, and in other embodiments, in the range of from 20 nm or more to 30 nm. This morphology provides pores in which it is difficult for nucleation of a water droplet to take place.

In some embodiments, the nanoporous assembly may be free standing, while, in other embodiments, the nanoporous assembly may cover a substrate, being physically or chemically secured thereto. Indeed, the substrate may be the surface for which the desired superhydrophobicity and/or steamphobicity is desired. For example, in a desire to impart superhydrophobicity or steamphobicity to an airplane wing, the material making up the exterior surface of the wing may serve as the substrate for a nanoporous assembly so that the nanoporous assembly can receive the interconnected network of the plasma polymerized plasma precursor, thus imparting the superhydrophobicity/steamphobicity to the wing.

The nanoporous assembly can be formed using a variety of nanodimensional materials including but not limited to nanofibers, nanohairs, nanotubes and combinations thereof. In some embodiments, these nanofibers, nanohairs, nanotubes and combinations thereof are formed of materials selected from carbon, metals, ceramics and combinations thereof. In these nanoporous assembly the hairs can be in form of aligned structures or as mesh like structures. For a particular embodiment herein, the nanoporous assemblies are formed of nanotubes formed of carbon. The diameter of these carbon nanotubes can vary from 1 nm to 50 nm, depending on the chemistry used.

An exemplary nanoporous assembly is an assembly of carbon nanotubes. In particular embodiments the carbon nanotubes are grown from a substrate to serve as the nanoporous assembly, wherein nanoscale gaps between the nanotubes define the pores of nanoscale dimension, as above. It should be appreciated that each tube is a "discrete" structure of the nanoporous assembly, being its own independent entity. When a plurality of nanotubes is used to cover a substrate, varying structures can occur. In some embodiments, the nanotubes align such that they are nearly vertical with respect to the substrate, thereby forming vertical pores in between the nanotubes. In other embodiments, the nanotubes tangle and overlap to form an interwoven mesh network, thereby forming pores in the spaces between the interwoven nanotubes. Thus the fact that the pores herein are defined between neighboring discrete structures of the nanoporous assembly should be readily appreciated. A nonwoven mat of electrospun fibers may also be an exemplary nanoporous assembly. In such a non-woven mat, it is possible that the mat will be made of one continuous fiber overlapping and entangling as known in the art of forming non-woven mats, and it should be appreciated that such a continuous fiber would define pores between neighboring portions of the continuous structure. The recitation of the nanoporous assembly having "discrete and/or continuous" structures should be interpreted in light of this general understanding. Again, this process may be practiced with or without the substrate.

In the general process of this invention, the plasma precursor is brought into the presence of the nanoporous assembly and is acted upon by the plasma generator to place the plasma precursor in the plasma state. The plasma precursors can be sourced from solid, liquid or gas sources, but, in particular embodiments, are ultimately brought into the presence of the nanoporous assembly and the plasma generator in the gaseous state to facilitate the transition to the plasma state. The gaseous form of the plasma precursor may be achieved through any suitable means, and pressure and temperature controls are likely candidtates. Also, low vapor pressures are typically necessary for plasma polymerization. The appropriate conditions are maintained so as to polymerize and/or crosslink the plasma precursors through plasma polymerization, such that the plasma precursor forms an interconnected network deposited on the surface of the nanoporous assembly. The thin coating of the plasma precursors maintains the morphology of the nanoporous assembly, as the plasma precursor, being in the plasma state, can flow in and around the individual discrete and/or continuous structures of the nanoporous assembly without closing off the pores. The specific plasma precursors chosen provide the desired surface energy.

Figure 2:
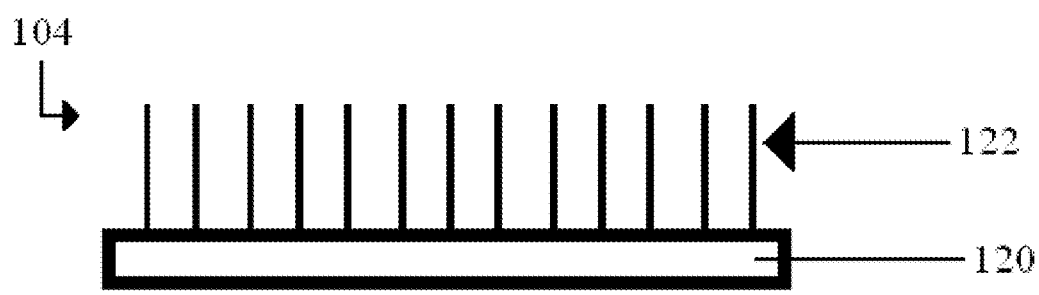
FIG. 2 is a general schematic diagram of an embodiment of a nanoporous construct employed in the process of this invention.

With reference to FIG. 1, an exemplary apparatus and method for the production of a coated nanoporous assembly in accordance with this invention is shown and designated by the numeral 100. A vacuum chamber 102 holds a nanoporous construct 104. With reference to FIG. 2, it can be seen that the nanoporous construct 104 of this invention includes a substrate 120 to which is physically or chemically secured a nanoporous assembly 122. This nanoporous construct is exemplary, and, as already mentioned a substrate need not always be employed. The chamber 102 is acted upon by a plasma source 106 and plasma precursors are added at a precursor inlet 108. The vacuum pump 110 is used to subject the chamber 102 to a vacuum pressure and the pressure can be monitored by the vacuum pressure gauge tube 112.

In some embodiments, the nanoporous construct 104 is placed inside the chamber 102 and the vacuum pump 110 is then engaged in order to achieve the desired pressure in chamber 102. After the plasma source 106 is activated in order to produce plasma, the plasma precursors are added to the chamber 102 via the precursor inlet 108. The vacuum pressure inside the chamber 102 retains the plasma precursors in the gaseous state, and in some cases may serve to vaporize plasma precursors sourced from liquid or solid sources. The plasma generated by the plasma source 102 serves to cause the plasma precursors to deposit onto the nanoporous construct 104, forming a coating thereon. This coating can be achieved through any type of plasma-induced restructuring of the plasma precursors due to the multiple propagating species present when in the plasma state. The restructuring is generally referred to as plasma polymerization and can include polymerizing and crosslinking and other bond formations.

Figure 3A:
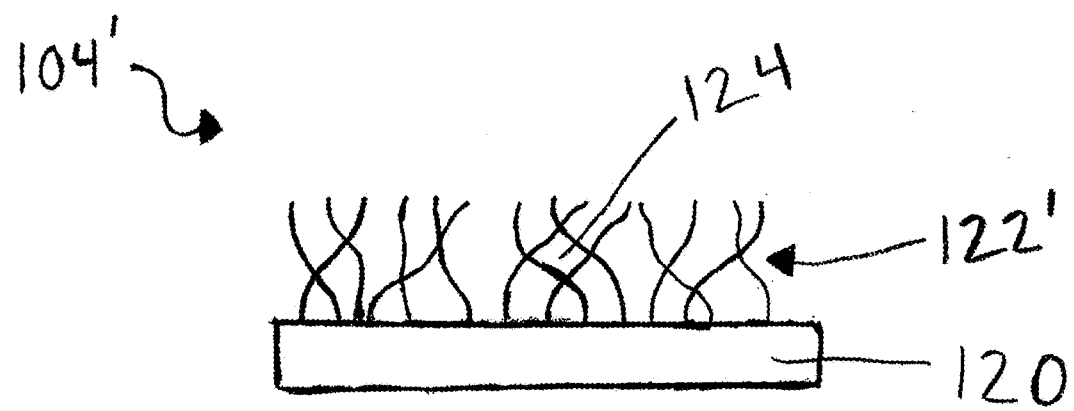
FIG. 3a is a general schematic diagram of an embodiment of a nanoporous construct wherein the nanoporous assembly is schematically represented with tangled and overlapping nanotubes.
Figure 3B:
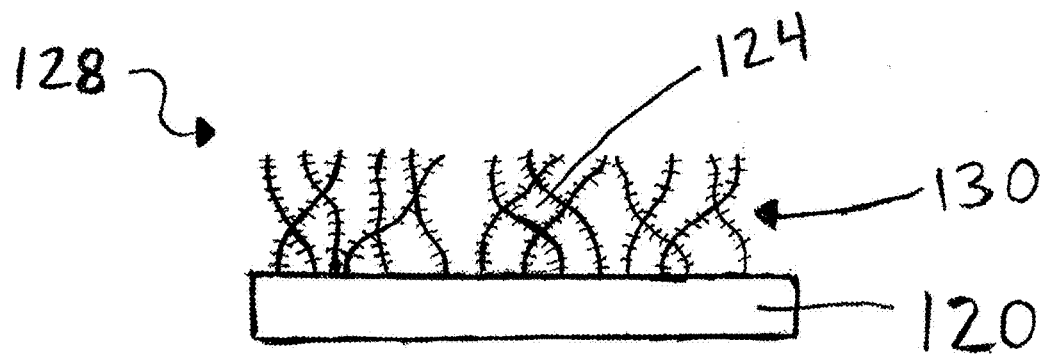
FIG. 3b is a general schematic diagram of an embodiment of a nanoporous construct coated by the process of this invention to provide a coated nanoporous assembly on a substrate.

FIG. 3a shows a different example of a nanoporous assembly 122' of a nanoporous construct 104', wherein the nanoporous assembly 122' is schematically represented with tangled and overlapping nanotubes that define pores such as pore 124. The final product of the precursor deposition is shown in FIG. 3b, wherein the coating 126 has been added. To create the final product, the plasma effects are continued until the plasma precursors form a stable coating 126 (represented by the small lines crossing the individual nanotubes) on the surfaces of the neighboring discrete and/or continuous structures forming the nanoporous assembly 122' of the nanoporous construct 104', thus substantially preserving the morphology thereof, as represented at the maintenance of pore 124. With an appropriate selection of plasma precursors, the resultant coated nanoporous construct 128, formed of a coated nanoporous assembly 130 on a substrate 120 will exhibit superhydrophobicity and/or steamphobicity and the ability to resist the nucleation and growth of water droplets. Once again, a substrate need not be employed.

The coating of plasma precursors is controllable because plasma polymerization techniques generally result in nearly uniform surface deposition. In particular embodiments, the thickness of the coatings on the discrete and/or continuous structures of the nanoassemblies is from 1 nm or more to 500 nm or less, in other embodiments, from 1 nm or more to 50 nm or less, in other embodiments, from 1 nm or more to 25 nm or less, and in other embodiments, from 1 nm or more to 15 nm or less.

In one or more embodiments, the process of the present invention is carried out a low pressure in order to ensure that the plasma precursors are in the gaseous state in the vacuum chamber 102 and that plasma polymerization is facilitated. In particular embodiments, the pressure of the vacuum chamber 102 is in the range from 50 mTorr or more to 500 mTorr or less. In other embodiments, the pressure of the vacuum chamber 102 is in the range from 100 mTorr or more to 300 mTorr or less, and in other embodiments, from 200 mTorr or more to 300 mTorr or less. The temperature in the vacuum chamber can be maintained to facilitate the gaseous state and conversion to the plasma state of the plasma precursors.

The substrate 120, if employed, can be any surface to which the nanoporous assembly 122 can be physically or chemically secured. In some embodiments, the nanoporous assembly 122 is used to cover the substrate 120 in order to provide beneficial properties to the coated nanoporous construct (like 128 of FIG. 3b) resulting from the process herein. Specific examples of suitable substrates include glass, metal, plastic, ceramic and rubber.

Plasma precursors are chosen based upon their ability to form a coating on the nanoporous assembly 122 when acted upon by the plasma generator and placed in the plasma state. The plasma precursors are also chosen for their ability to impart the desired superhydrophobicity and/or steamphobicity property to the nanoporous assembly 122. These properties are achieved, in conjunction with the morphology concerns noted above, by choosing plasma precursors that form a coating have a low surface energy. In certain embodiments, the surface energy is in a range from 5 dynes/cm or more to 30 dynes/cm or less. In other embodiments, the plasma precursors are chosen to form a coating having a surface energy of from 5 dynes/cm or more to 25 dynes/cm or less, in other embodiments, from 8 dynes/cm or more to 20 dynes/cm or less, in other embodiments, from 8 dynes/cm or more to 15 dynes/cm or less, and, in other embodiments from 8 dynes/cm or more to 10 dynes/cm or less.

Non-limiting examples plasma precursors include perfluorocarbon compounds and perfluorinated compounds. The compounds, having CF2 or CF3 groups tend to exhibit low surface energy as coatings, and the plasma precursors are chosen based on the surface energy of the coating they create. An example of a particular perfluorinated compound useful in accordance with this invention includes 1H,1H, 2H-perfluoro-1-dodecene.

The plasma is generated from a plasma source 102, which can be any known device for creating plasma. In certain embodiments, the plasma is created by using a radiofrequency generator. In other embodiments, the plasma is generated by an electromagnetic device. In some embodiments, a matching network and copper coil are used in order to supply the vacuum chamber with the desired plasma.

In some embodiments, the plasma source produces plasma inside of a vacuum chamber, as in chamber 102. In other embodiments, the plasma can be applied outside of a vacuum chamber, such as through the use of a plasma gun. In these embodiments, the plasma precursor is vaporized locally at the location of the nanoporous assembly and plasma gun in order to be converted to the plasma state and deposited on the nanoporous assembly.

The coated nanoporous assembly has beneficial properties that cannot be achieved by the nanoporous assembly itself, before coating. The coated nanoporous assembly exhibits high resistance to wetting by both water and oil. In certain embodiments, the coated nanoporous assembly is highly resistant to steam. In other embodiments, the coated nanoporous assembly exhibits poor ice formation on the surface, thereby becoming highly resistant to ice. These improved properties allow the coated nanoporous to serve in particular applications such as airplane wings, steam turbine blades and heat exchanger surfaces, among other applications that will be found useful by those of skill in the art.

In a particular embodiment, the nanoporous construct includes a nanoporous assembly of carbon nanotubes on a stainless steel substrate, and the plasma precursor deposited on the assembly is 1H,1H,2H-perfluoro-1-dodecene. One advantage of the present invention is the ability of the coating to repel water for an extended period of time. In one embodiment, the coating is able to repel steam for a time period of 10 hours or more.

In light of the foregoing, it should be appreciated that the present invention significantly advances the art by providing an apparatus and method for the production of superhydrophobic surface coatings that are structurally and functionally improved in a number of ways. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

EXAMPLES

Meshlike CNT's are grown on acid-treated stainless steel substrates using a floating catalyst chemical vapor deposition (CVD) process. The CVD process is carried out in a tubular reactor. The stainless steel (SS 304) plates are acid treated by etching in 9 M $H_2SO_4$ for 10 min, followed by washing with deionized water. Xylene was used as the carbon source, and ferrocene was used as the catalyst. The acid treated stainless steel plates are heated to 750° C. inside the furnace under an argon-hydrogen (85:15 v/v) flow atmosphere. The vapors of the solution of 1 g of ferrocene in 100 mL of xylene are sublimed at 190° C. and introduced into the furnace at a rate of 0.11 mL/min. Further details of the procedure for CNT growth are described elsewhere.

The meshlike structure is coated using rf-PECVD (radio frequency plasma-enhanced chemical vapor deposition). The precursor chosen for PECVD is 1H,1H,2H-perfluoro-1-dodecene ($C_{10}F_{21}$—CH=$CH_2$) (97% pure, purchased from Matrix Scientific), which is a representative of the class of long-chain perfluoro alkyl monomers. The plasma deposited film of this monomer has been reported to have a low surface energy value of 7.5 mN m$^{-1}$, making the surface hydrophobic as well as oleophobic. The PECVD experiments are carried out in an inductively coupled, cylindrical vacuum chamber. The coupling is done through an impedance-matching network that connects the coil wound around the chamber to the radio frequency generator operated at 13.56 MHz. The reactor is connected to the rough pump via a pressure gauge and a liquid nitrogen cold trap. The glass tube containing the liquid precursor is connected to the inlet of the chamber, and the control valve is used to adjust and monitor the vapor pressure. For the precursor chosen, the deposition is carried out at a vapor pressure of 200 mTorr. The chamber is operated in continuous mode at 35 W input power. A typical cycle consisted of three steps of 5 min each and followed as precursor vaporization, plasma ignition, and precursor vaporization. Clean aluminum plates and silicon wafers are used as flat reference substrates.

Scanning electron microscopy (SEM) and transmission electron microscopy (TEM) are used to characterize the CNT mesh. A JEOL JSM-7401F field emission scanning electron microscope was used to acquire SEM images. Images were acquired under a vacuum of 10$^{-6}$ Torr and a potential difference of 5 kV. No sputter coating was required for the current samples. TEM images were acquired using a JEOL JEM 1230 electron microscope at a potential difference of 120 kV. The diameter distribution of uncoated and plasma-coated CNT's is obtained and compared by calculating the diameters of about 130 tubes in each case.

IR spectroscopy and XPS are used for chemical composition analysis. The FTS 3000 Excalibur Series DIGILAB IR spectrometer is used in transmission mode. A standard IR liquid cell is used to obtain the IR spectrum of the liquid precursor. The plasma-enhanced films are deposited on the compression-molded KBr discs formed with IR-grade KBr powder (purchased from Sigma-Aldrich), and the spectra are acquired in transmission mode. Sixty-four scans are collected for IR spectra of both the background and the sample. The XPS spectra are collected using a PHI Quantum 2000 scanning XPS microprobe instrument that uses Al Kα radiation. The survey spectra are acquired to detect the presence of elements on the surface. The survey scans are obtained over the entire range of binding energies (i.e., 0-1000 eV with a pass energy of 117.5 eV and a step size of 0.5 eV). The survey scans are run for 5 min. The high-resolution spectra for the C 1s and F 1s regions are obtained over a 20 eV binding energy width (i.e., 280-300 eV for C 1s and 680-700 eV for the F 1s region). The high-resolution spectra in the C 1s region are acquired at an 11.75 eV pass energy and a 0.05 eV step size. The F 1s region spectra are obtained at a 58.7 eV pass energy and a 0.125 eV step size. The high-resolution scans in the C is and F is regions are run for 10 min. These spectra are also used for chemical quantification.

The wetting behavior of plasma-coated (PCNT) and uncoated (CNT) mesh is studied by contact angle analysis. CNT and PCNT surfaces are exposed to steam and analyzed visually. Immediately after exposure to steam, contact angles are measured on the surfaces at room temperature. The contact angle measurements are carried out using Ramé-Hart Instruments Advanced Goniometer 500 F1 with Drop Image Advanced software. The contact angle is measured with an 8-10 μL droplet of deionized water. The contact angle hysteresis is measured by tilting the base until the drop rolls off the surface. The steam condensation experiments are carried out by exposing the sample to a continuous stream of condensing steam. Steam is generated in a steam chamber composed of stainless steel and heated using resistive heating. The temperature of the chamber is monitored using a J-thermocouple and kept constant for all of the measurements. The chamber is fed with water at a continuous rate. As the water enters the heated chamber, it boils. This generated steam generated is carried through a stainless steel pipe to the sample block in which the sample plates are held horizontally. The entire assembly is thermally insulated to minimize the loss of heat to the atmosphere. The sample holder block is provided with a thermocouple, and the temperature inside the holder is monitored continuously. The samples are exposed to condensing steam at atmospheric pressure and a temperature of 96+/−2° C. throughout the experiment. Immediately after steam exposure, the water contact angle is measured and plotted as a function of the steam exposure time.

Figure 4:
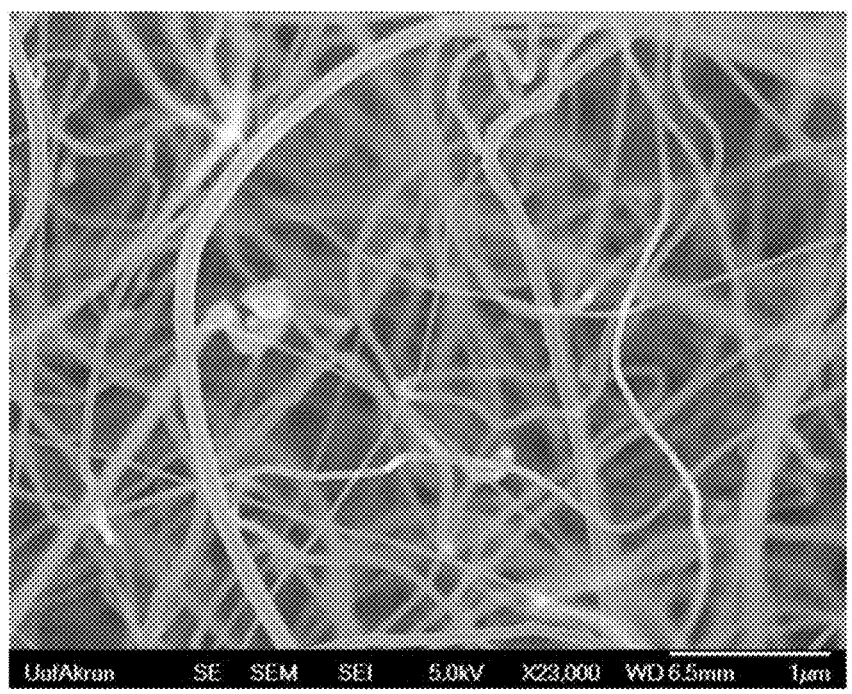
FIG. 4 is an SEM image of a mesh-like, nanoporous carbon nanotube (CNT) mat on the surface of a stainless steel plate.
Figure 5:
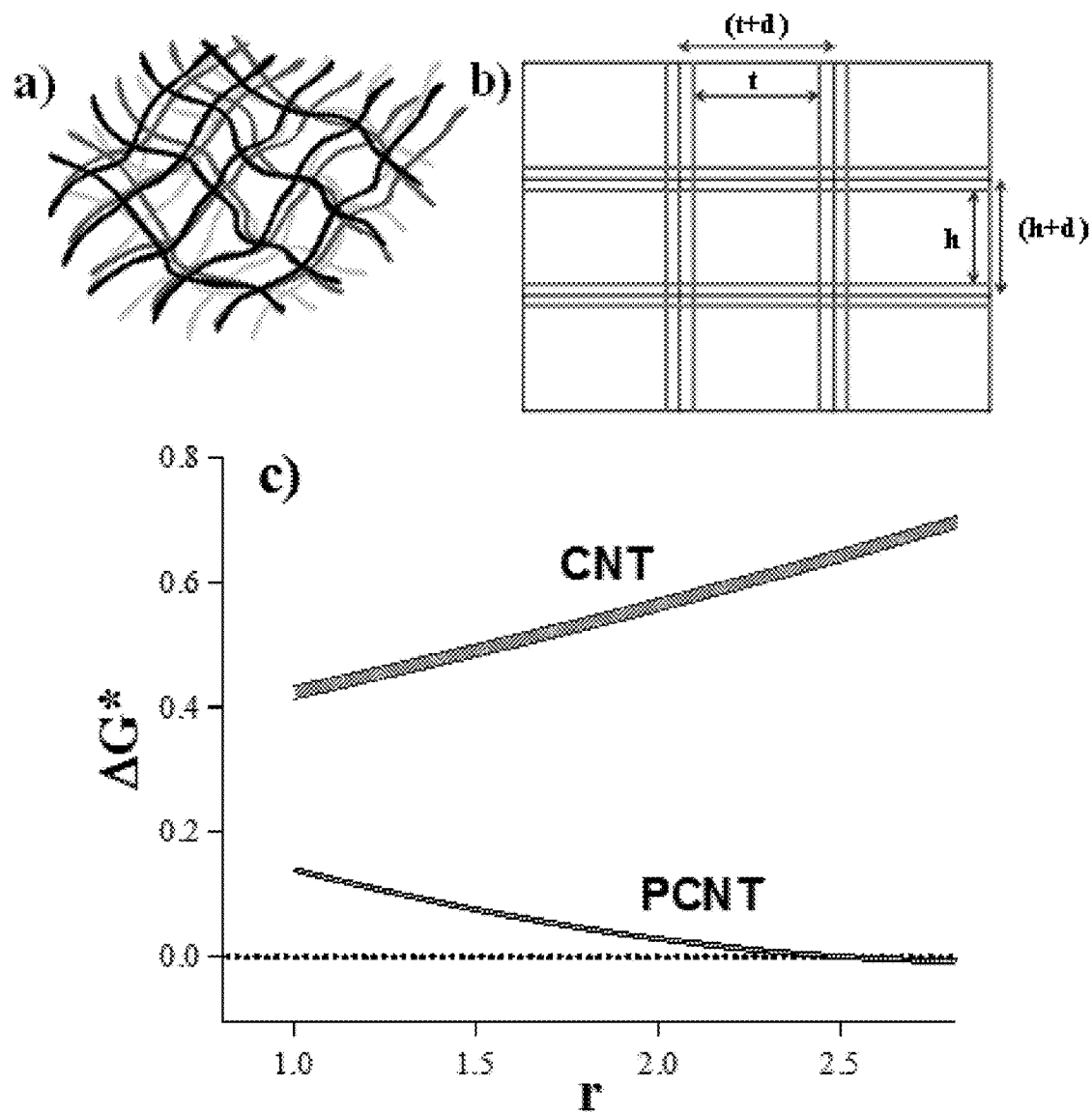
FIG. 5a is a schematic showing the CNT mesh structure, wherein the structure can be visualized as multiple meshes stacked on top of each other.
FIG. 5b is a schematic of the rectangular unit cell model, wherein the model has inner side dimensions of (t×h) and outer dimensions of (t+d)×(h+d), wherein t and h are the average length and width, respectively, of a rectangular cavity between nanotubes in a mesh structure and d is the average diameter of the CNT.
FIG. 5c is a graph, wherein $\Delta G^*$ is calculated as a function of r for $\theta_Y=80°$ (CNT) and $\theta_Y=110°$ (PCNT) for $1 \leq r \leq 2.9$, wherein the calculation of $\Delta G^*$ ($G^*_{CB}-G^*_W$) depends on the value of $f_s$, wherein the value of $f_s$ is calculated to be 0.204+/−0.05 using the rectangular cell model, wherein at every point $G^*_{CB}$ was calculated for the corresponding $f_s$ value, wherein the difference between $G^*_{CB}$ and $G^*_W$ was plotted as a function of r, wherein the range of $f_s$ determines the lower and upper limits for $\Delta G^*$ in the cases of both CNT and PCNT as shown by highlighted regions in the graph, and wherein, for any given r, the range of $\Delta G^*$ can be estimated from the model calculations here.

The CNT mats grown on stainless steel plates show nonaligned meshlike morphology, as can be seen in the SEM image (FIG. 4). In 3D space, the morphology of the layer of CNT's formed can be visualized as a stack of many of such entangled meshes as shown schematically in FIG. 5a. Calculations for $f_s$ used in the Cassie-Baxter model are based on a rectangular unit cell shown in FIG. 5b. FIG. 5b represents the single topmost layer of a meshlike structure. In the Cassie-Baxter state, the water droplet is assumed to be in contact with the projection of this single layer and not the entire thickness of the CNT mesh. The average length t and the average width h of a rectangular cavity enclosed by four nanotubes are determined from SEM images using Image J software. In each SEM image, about 20 rectangular unit cells are chosen at different positions, an image is rotated as required to be able to draw a rectangle that fits the given unit cell, and the values of t and h are calculated. The same procedure is repeated for about 8-10 SEM images to calculate average values and standard deviations.

Figure 6:
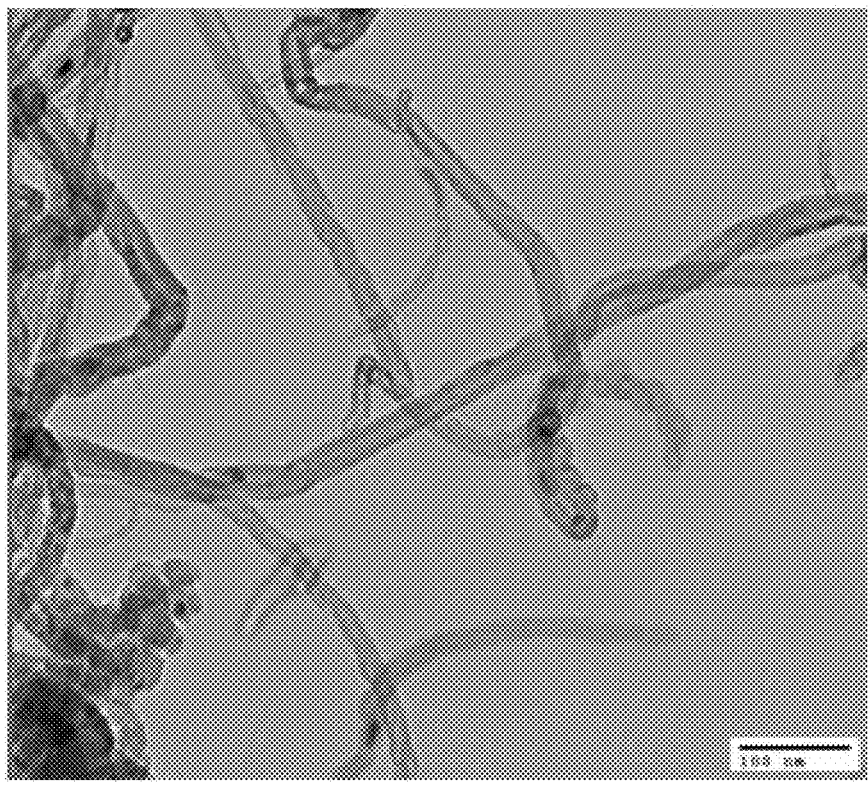
FIG. 6 is a TEM image of CNT's.
Figure 7:
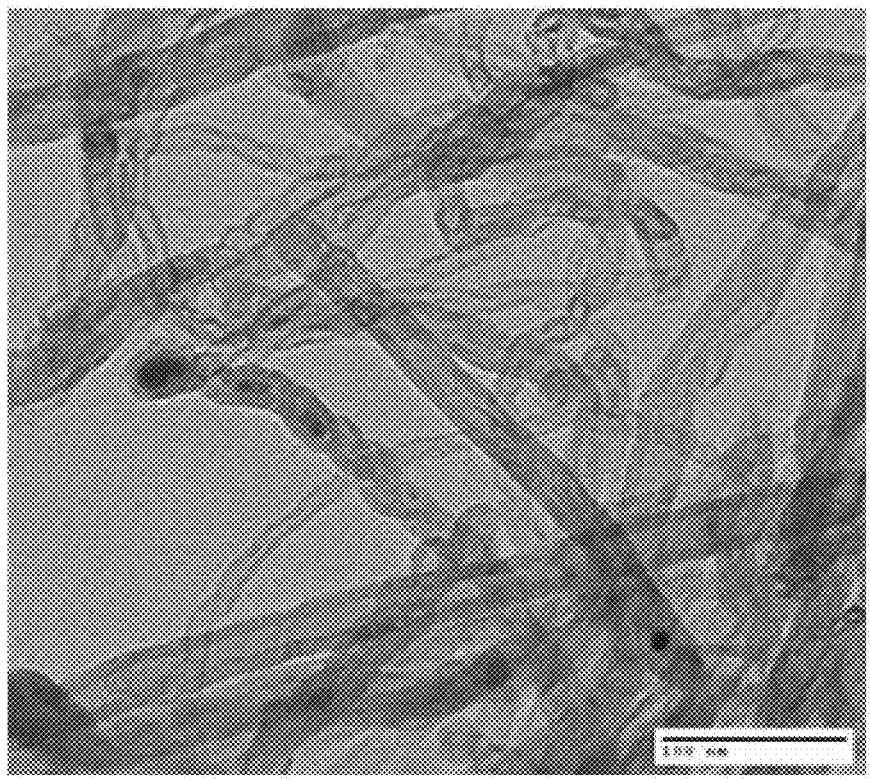
FIG. 7 is a TEM image of plasma-coated carbon nanotubes (PCNT's)
Figure 8:
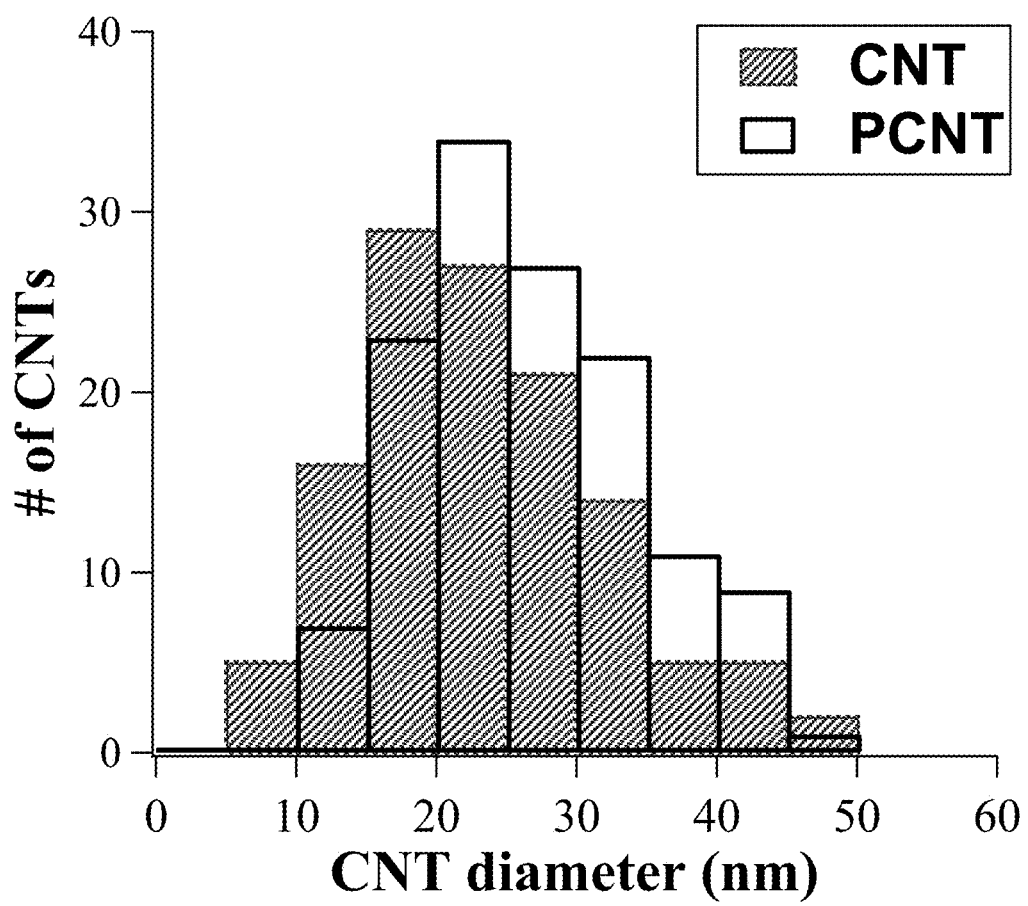
FIG. 8 is a graph of the diameter distribution of uncoated (CNT) and plasma-coated CNT's (PCNT)
Figure 13:
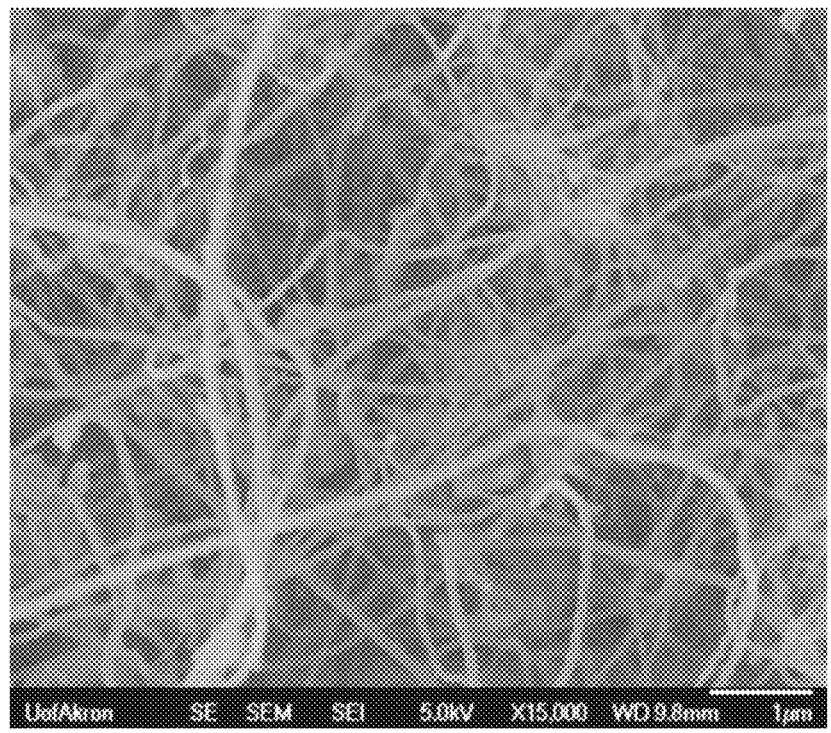
FIG. 13 is an SEM image of a mesh-like, nanoporous carbon nanotube (CNT) mat on the surface of a stainless steel plate, as in FIG. 4, but shown with a coating thereon in accordance with this invention.

The SEM image in FIG. 4 shows the structure of as-grown CNT's on stainless steel (SS) plates. The morphology of CNT mats can be described as an entangled nanoporous structure. This morphology is retained even after the deposition of the plasma coating. The PCNT structures are not easily distinguishable from CNT structures, as can be seen by comparing SEM images (like those of FIGS. 4 and 13). The thickness of the plasma-coated films on CNT is estimated by the analysis of the distribution of diameters of CNT's. TEM is used to image the CNT structure (as shown in FIGS. 6 and 7), and Image J software is used to analyze the tube diameters. FIG. 8 compares the overall size distribution of CNT's and PCNT's. It can be seen that the minimum diameter range for CNT's is 5-10 nm, whereas for PCNT's it is 10-15 nm. The peak in the diameter distribution of CNT's lies in the 15-20 nm range. In the case of PCNT's, it is seen to be in the 20-25-nm-diameter range. From these observations, the thickness of the plasma-deposited coating can be approximated to be about 5-10 nm, which is not easily detectable with the resolution limits of the imaging instruments used and given the non-uniformity of the tube diameters. Thus, the size distribution analysis gives a good estimate of the coating thickness, and the thin layer of the plasma coating serves the purpose of surface chemistry modification without significantly affecting the nanostructure of the CNT's. A thin layer of an organic coating is also desirable for preventing any significant effects on heat transfer coefficients.

Figure 9:
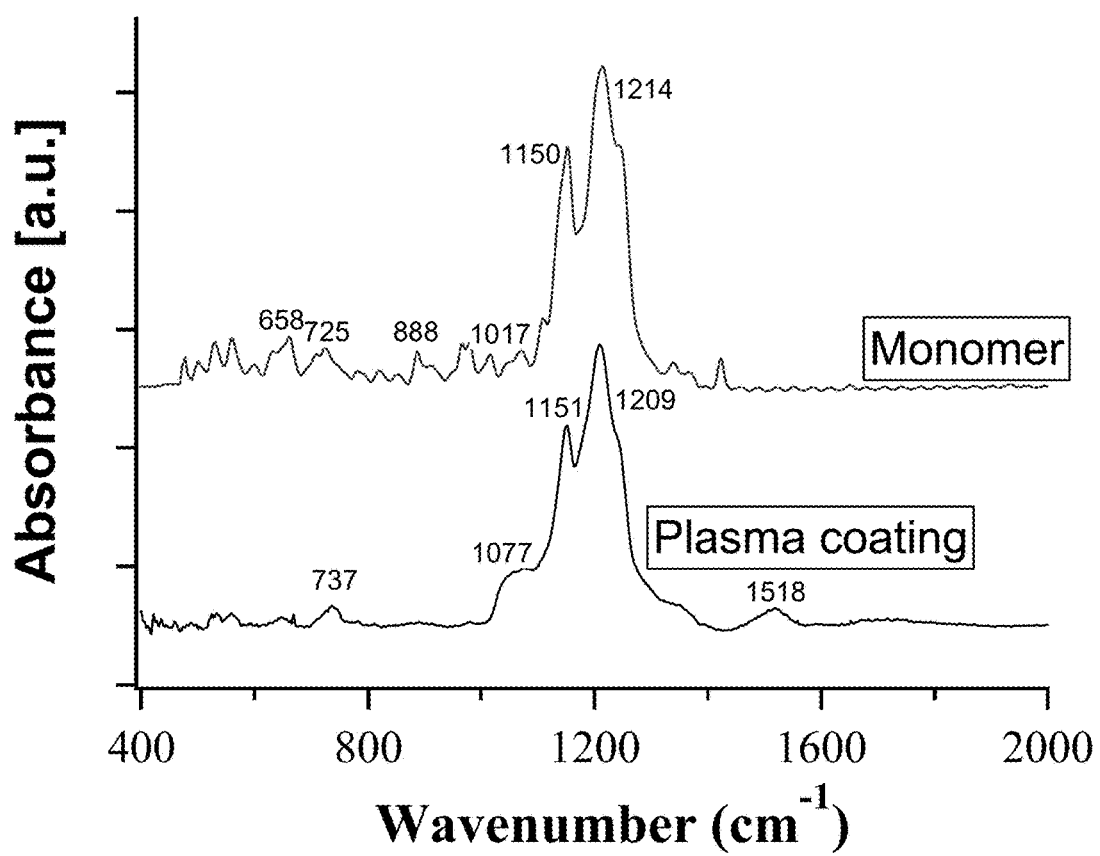
FIG. 9 is a graph of the IR spectra of the monomer and the coating formed by PECVD.

To confirm the presence of plasma-coated films on nanostructures further, the IR spectra of the 1H,1H,2H-perfluoro-1-dodecene monomer and the coating formed by plasma-enhanced deposition are compared (FIG. 9). The IR spectrum of the plasma-deposited coating shows that there is a loss of characteristic alkene C—H bending vibrations in the 1000-650 cm$^{-1}$ region. This implies the activation of the double bond of the monomer in the plasma state. The characteristic perfluoroalkyl chain stretching bands are observed in the 1110-1280 cm$^{-1}$ ($CF_2$) and 1110-1340 cm$^{-1}$ ($CF_3$) regions in both the monomer and the plasma-deposited coating. The broadening of the peaks in this region for the plasma-deposited coating can be attributed to the lower structural retention of the monomer arising from the fragmentation, rearrangement, and cross-linking reactions that take place in the plasma-enhanced deposition process.

Figure 10:
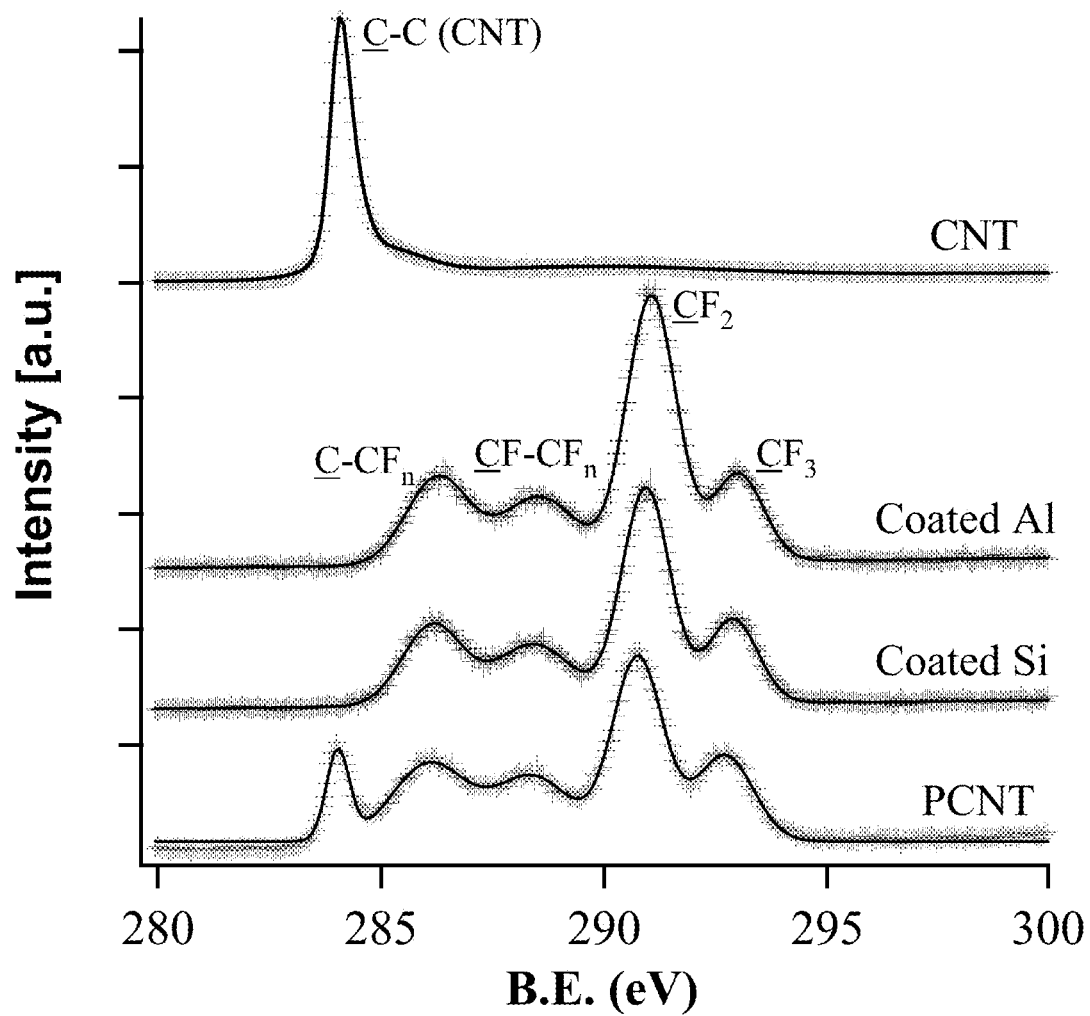
FIG. 10 is a graph of the XPS C 1s spectra of uncoated (CNT) and plasma-coated (PCNT) CNT's and plasma-coated Al and Si.

The quantitative chemical analysis of the plasma-deposited coating is carried out with XPS. FIG. 10 shows the C 1s spectra of uncoated CNT mats and 1H,1H,2H-perfluoro-1-dodecene plasma-coated CNT mats. The C 1s spectra of the same plasma coating on the aluminum and silicon surfaces that are used as reference flat substrates are also shown in FIG. 10. The spectra are fitted to a Gauss-Lorentz function. The main peak in the case of uncoated CNT's, which shows up at around 284 eV, can be assigned to the graphitic C—C bond in a carbon nanotube. The spectra for coated aluminum and silicon surfaces look almost identical and do not show any peak at 284 eV. All four peaks observed for the coating on aluminum and silicon can be assigned to the characteristic binding-energy range of C—$F_n$ bonds. The percent retention of $CF_2$ (291 eV) and $CF_3$ (293 eV) at the surfaces can be estimated by integrating the area under the curve. This is particularly significant because the presence of these functional groups on the surface is responsible for making the CNT surface hydrophobic (i.e., modifying its intrinsic wettability). In the case of PCNT's, an additional peak at around 284 eV is assigned to the C—C bond of CNT. The presence of this peak along with other C—$F_n$ peaks implies that the thickness of the coating on CNT should be less than the typical analysis depth of about 10 nm for XPS. Therefore, the thickness of the coating that is estimated is consistent with the results obtained with the size distribution analysis of the tubes. The comparable values obtained from the functionality retention and F/C atomic ratios of plasma-coated aluminum, silicon, and CNT's are consistent with the fact that PECVD was carried out under identical conditions for the deposition of the coating on all of the surfaces. The F is spectra obtained for all of the samples show a single peak at about 688 eV that can be assigned to the C—F bond (corresponding data in Supporting Information). XPS analysis thus confirms the presence of a thin layer of a plasma-deposited coating on the carbon nanotube surface.

Figure 11:
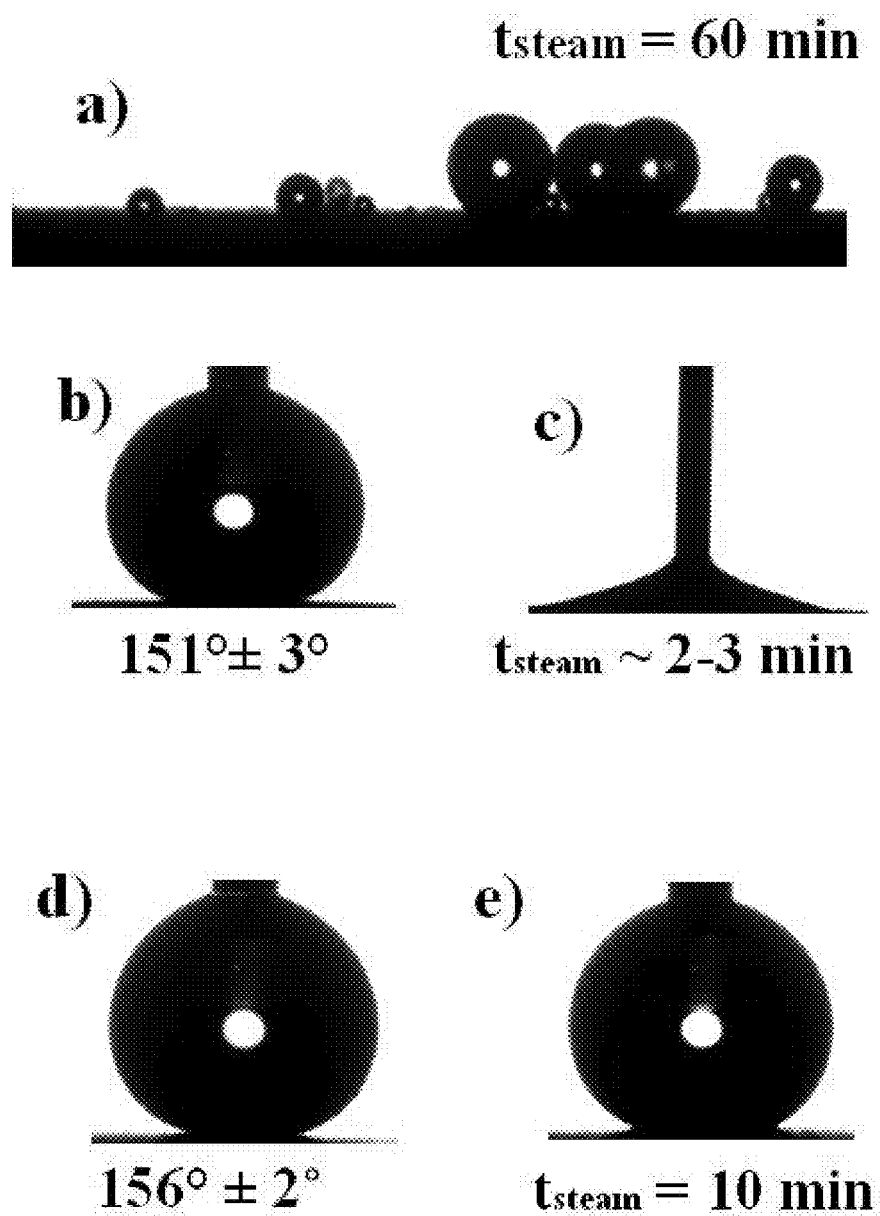
FIG. 11a is an image of condensed steam droplets on the PCNT surface after steam exposure for 1 hour.
FIG. 11b is an image, wherein the contact angle has been measured on a CNT (uncoated) surface.
FIG. 11c is an image, wherein the contact angle has been measured on a CNT (uncoated) surface following steam condensation.
FIG. 11d is an image, wherein the contact angle has been measured on a PCNT (plasma-coated) surface.
FIG. 11e is an image, wherein the contact angle has been measured on a PCNT (plasma-coated) surface following steam condensation.

CNT mats show a water contact angle of 151+/−3° and a CAH of 5°. The water contact angle on the PCNT surface is 156+/−2°, and the CAH is 2°. Thus, there is no significant difference in the wetting behavior of CNT and PCNT in the water contact angle test, and both surfaces can be characterized as superhydrophobic. FIGS. 11b and 11d show optical images of water droplets on CNT and PCNT surfaces.

Figure 12:
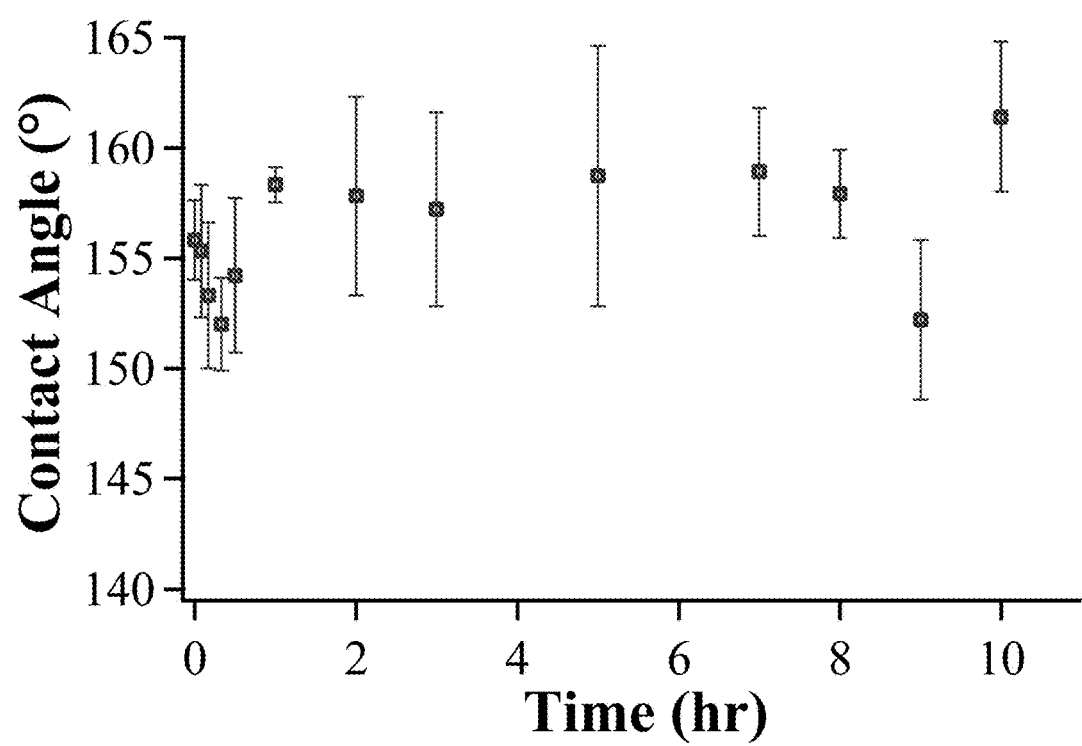
FIG. 12 is a graph of the water contact angle measured on PCNT's as a function of the steam exposure time.

Under steam condensation, however, it is observed that the two surfaces are drastically different in their wetting properties. The experiments consist of exposing the CNT and PCNT surfaces (held horizontally) to the condensing steam flux and, following steam exposure, measuring the water contact angle by depositing a water droplet on the surface. Upon exposure to steam, it is seen that the condensate forms as small spherical droplets on the PCNT surface, as shown in FIG. 11a. The non-uniform coverage of these droplets on the surface may imply the removal of larger droplets by coalescence. The droplet size continues to shrink because of evaporation, and eventually no droplets are seen on the surface. When the PCNT surface is measured for its water contact angle, it is seen that the surface is superhydrophobic even after it is exposed to steam (FIG. 11e). However, in the case of an uncoated CNT mat, within the timescale of minutes, a thin film of condensed water appears to be formed upon steam exposure. Even though the film is not clearly visible, the complete wetting of the deposited droplet following steam exposure on this surface implies the presence of a thin water film. Thus, the uncoated CNT surface loses its superhydrophobicity upon exposure to steam (FIG. 11c). We also observe that the superhydrophobicity of the CNT surface is restored after it is dried off completely. FIG. 12 shows the contact angle measured on PCNT mats after prolonged exposure to steam as a function of exposure time. Interestingly, it is observed that the superhydrophobicity of the PCNT surface is retained even after steam exposure of as long as 10 h, whereas the CNT surface loses its superhydrophobicity when exposed to steam for only a few minutes.

Differences in the wetting behavior of PCNT and CNT mats under steam condensation can be explained on the basis of the modification of the surface chemistry and thus the intrinsic wettability ($\theta_Y$) of CNT's. The intrinsic contact angle of the surface of a single CNT has been measured to be about 80°. After plasma coating, we estimate the intrinsic contact angle of the PCNT surface to be 110° from the contact angles measured for plasma-coated flat plates. We propose here a model to predict whether the Cassie-Baxter or the Wenzel states are thermodynamically favored for CNT or PCNT surfaces. The free energy of the given wetting state as a function of the corresponding apparent contact angle ($\theta$) and intrinsic wettability ($\theta_Y$) can be expressed in its dimensionless expression form. For a Wenzel state, the free energy can be written as $$G^*_W=[F(\theta_W)]^{-2/3}[2-2\cos\theta_W-r\sin^2\theta_W\cos\theta_Y]$$

where $\theta_W$ is the Wenzel contact angle that is defined as follows:

$$\cos\theta_W=r\cos\theta_Y$$

Here, r is the surface roughness defined as the ratio of the actual surface area to the projected surface area (r>1). $F(\theta)$ is defined as:

$$[F(\theta)]=(2-3\cos\theta+\cos^3\theta)$$

Similarly, the expression for the free energy of the Cassie-Baxter state can be written as $$G^*_{CB}=[F(\theta_{CB})]^{-2/3}[2-2\cos\theta_{CB}-\sin^2\theta_{CB}(-1+f_s+f_s\cos\theta_Y)]$$

Here, $\theta_{CB}$ is the Cassie-Baxter contact angle defined as $$\cos\theta_{CB}=-1+f_s(1+\cos\theta_Y)$$

$f_s$ is the fraction of solid in contact with water when the droplet is supported on an air-solid composite surface. The free-energy difference between the Cassie-Baxter and Wenzel states can be defined as $\Delta G^*=G^*_{CB}-G^*_W$. We use a model rectangular unit cell as shown in FIG. 5b to estimate $f_s$. Using SEM and image analysis, we calculate $f_s=0.204$ (0.05. On the basis of the values of $f_s$, the model predicts the $\theta_{CB}$ value to be 140+/−5° for CNT surface and 150+/−4° for PCNT surface. It can be seen that the $\theta_{CB}$ values calculated using the Cassie-Baxter model are close to the static contact angle measured experimentally. Because $0°\le\theta_W\le180°$, $G^*W$ and thus $\Delta G^*$ can be defined only for $1\le r\le2.92$. The upper limit on r is imposed by $\theta_Y=110°$ for PCNT. In the range of r where the real $\theta_W$ value is defined, it can be seen (FIG. 5c) that $\Delta G^*$ for a CNT surface is an increasing function of r, implying that the Wenzel state becomes more favorable as the surface roughness increases for $\theta_Y=80°$. In the case of the PCNT surface with $\theta_Y=110°$, $\Delta G^*$ decreases as r increases and crosses the $\Delta G^*=0$ line for higher values of r. The negative values of $\Delta G^*$ imply that the Cassie-Baxter state becomes the thermodynamically more favorable state as the surface roughness is increased. For these CNT and PCNT surfaces, we expect r to be high, most likely greater than 3. Thus, for the nanoporous meshlike PCNT surface the Cassie-Baxter state with a high contact angle is more favored whereas for the CNT surface the Wenzel state with a low contact angle is more favored thermodynamically. This implies that even though the Cassie-Baxter wetting state is possible for both CNT and PCNT surfaces (on the basis of estimated values of $f_s$), thermodynamically it represents only a metastable state for the CNT surface. After steam condensation, when a droplet in the more stable Wenzel state is formed on this surface, its failure to transition to the Cassie-Baxter state results in the loss of superhydrophobicity. However, even if a condensate forms a Wenzel state droplet upon exposure to steam on the PCNT surface, the transition from the Wenzel to the Cassie-Baxter state is favored in this case. This explains the retention of the superhydrophobicity of a PCNT surface even after prolonged exposure to steam.

Steam condensation involves the nucleation and coalescence of the condensed droplets. From the classical theory of the nucleation and growth of a condensate, it is known that nucleation rates are dependent on the intrinsic wettability ($\theta_Y$) of the surface. It is estimated that the free-energy barrier that is required to be overcome for the condensation of water vapor is higher and condensation rates are lower on a hydrophobic surface compared to those on a hydrophilic surface. The hydrophobic surfaces delay the nucleation but do not completely eliminate this process. During coalescence, if the Wenzel state is preferred then the surfaces will exhibit lower contact angles than the metastable Cassie-Baxter state and this is the case for the CNT samples without the fluorinated coatings. However, if the Cassie-Baxter state is a true thermodynamically stable state, then the coalescence droplets will be expelled outward and the superhydrophobic Cassie-Baxter state will be preferred. Therefore, fluorinated coatings on CNT result in lower nucleation rates as well as a stable Cassie-Baxter state to keep the surfaces dry and stable during steam condensation.

It can thus be concluded here that two surfaces that do not differ much structurally and are characterized as superhydrophobic surfaces exhibit extreme steamphobic behavior. The combination of the nanoscale roughness of the CNT mats along with the surface energy contrast achieved by the deposition of a low surface-energy plasma-deposited coating results in the formation of a highly robust steamphobic surface. The biggest advantage of the PECVD process used here for chemical modification is that it is a completely dry process. Unlike wet processes, in which the capillary forces tend to collapse the nanoporosity, the PECVD process enables the deposition of a very thin layer of a film on such a surface without disturbing its structural integrity. The use of stainless steel to form the steamphobic coatings is an added advantage because it is a widely used industrial material. The robust steamphobic surfaces are of particular interest in designing heat exchangers. They are ideal for dropwise steam condensation and can be expected to improve the exchanger efficiency remarkably because of the fast droplet removal and low adhesion of condensed steam to the surfaces. The robustness of the structure can also be taken advantage of in anti-fog, anti-ice, and anti-dew coatings.

What is claimed is:

1. A method for creating a superhydrophobic coated nanoporous assembly having steamphobic properties, the method comprising:
   providing a non-water soluble and heat resistant nanoporous assembly formed of discrete or continuous or both discrete and continuous structures that provide a morphology defining pores of less than 500 nm between neighboring discrete and continuous structures;
   bringing gaseous plasma precursors in the presence of the nanoporous assembly and in the presence of a plasma generator;
   employing the plasma generator to convert the gaseous plasma precursors to the plasma state; and
   permitting the plasma precursors to deposit as a coating on the nanoporous assembly through plasma polymerization techniques the deposition thereof preserving the porous structure of the nanoporous assembly, the deposited coating exhibiting a surface energy of less than 30 dynes/cm due to the selection of plasma precursors.

2. The method of claim 1 wherein the nanoporous assembly is physically or chemically secured to a substrate.

3. The method of claim 1 wherein the nanoporous assembly is selected from nanofibers, nanohairs, nanotubes and combinations thereof.

4. The method of claim 3 wherein the nanoporous assembly is formed of materials selected from carbon, metals, ceramics and combinations thereof.

5. The method of claim 1 wherein the plasma precursors are selected from perfluorocarbons and perfluorinated compounds.

6. The method of claim 1 wherein the pores range from 5 nm or more to 50 nm or less.

7. The method of claim 1 wherein the surface energy of the nanoporous assembly ranges from 8 dynes/cm or more to 20 dynes/cm or less.

8. The method of claim 1 wherein the plasma precursor is 1H,1H,2H-perfluoro-1-dodecene and the nanoporous assembly is formed of carbon nanotubes.

9. The method of claim 2 wherein neither said substrate nor said nanoporous assembly degrades when contacted by steam.

10. The method of claim 2 wherein said substrate comprises a metal or metal alloy.

\* \* \* \* \*